United States Patent [19]

Rao

[11] Patent Number: 4,975,386

[45] Date of Patent: Dec. 4, 1990

[54] PROCESS ENHANCEMENT USING MOLYBDENUM PLUGS IN FABRICATING INTEGRATED CIRCUITS

[75] Inventor: Raman K. Rao, Palo Alto, Calif.

[73] Assignee: Micro Power Systems, Inc., Santa Clara, Calif.

[21] Appl. No.: 455,094

[22] Filed: Dec. 22, 1989

[51] Int. Cl.$^5$ .............................................. H01L 21/70
[52] U.S. Cl. ..................... 437/60; 437/192; 437/918; 437/47; 437/190; 148/DIG. 136
[58] Field of Search ............. 437/192, 60, 918, 47, 437/190; 148/DIG. 136; 427/103

[56] References Cited

U.S. PATENT DOCUMENTS

| | | | |
|---|---|---|---|
| 3,649,945 | 3/1972 | Waits | 427/103 |
| 3,996,551 | 12/1976 | Croson | 427/103 |
| 4,569,122 | 2/1986 | Chan | 437/192 |
| 4,581,815 | 4/1986 | Cheung et al. | 437/60 |
| 4,582,563 | 4/1986 | Hazuki et al. | 437/192 |
| 4,755,480 | 7/1988 | Yau et al. | 437/60 |
| 4,884,123 | 11/1989 | Dixit et al. | 437/192 |
| 4,898,838 | 2/1990 | Morris et al. | 437/160 |
| 4,906,593 | 3/1990 | Shioya et al. | 437/192 |

FOREIGN PATENT DOCUMENTS

| | | | |
|---|---|---|---|
| 0137701 | 4/1985 | European Pat. Off. | 437/192 |
| 0145926 | 6/1985 | European Pat. Off. | 437/918 |
| 0226549 | 6/1987 | European Pat. Off. | 437/918 |
| 0121925 | 7/1984 | Japan | 437/192 |
| 0220441 | 9/1986 | Japan | 437/192 |

Primary Examiner—Brian E. Hearn
Assistant Examiner—Trung Dang
Attorney, Agent, or Firm—Henry K. Woodward

[57] ABSTRACT

A method of interconnecting circuit components in a semiconductor integrated circuit including component elements formed in the substrate and thin-film resistors and capacitors formed on a surface of the substrate, a molybdenum plug is utilized to facilitate stable, uniform low resistance contacts to circuit elements, molybdenum (moly) plugs are utilized as a barrier between interconnect metallization and the circuit components. A CLAD moly/aluminum metallization interconnect can be fabricated in a standard process in which the moly plugs are formed. The accuracy and stability of thin-film resistors is facilitated during wafer processing, laser trimming, temperature cycling, and assembly processing thereby providing repeatable matching by eliminating contact resistance as a process variable.

11 Claims, 4 Drawing Sheets

FIG.—1

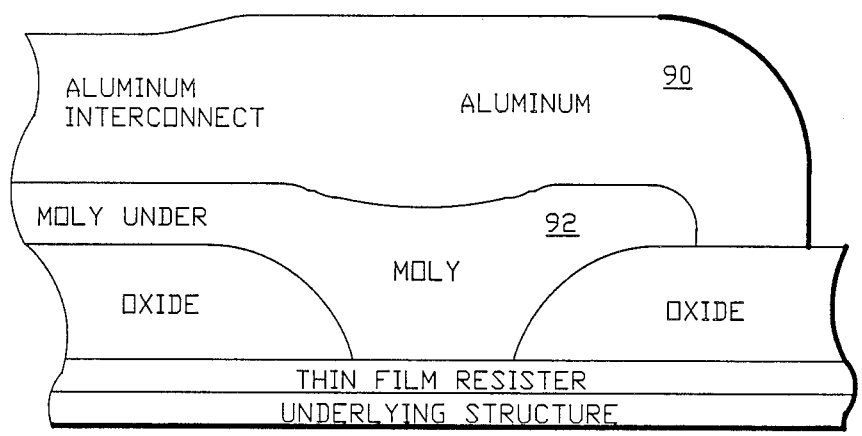
FIG.—5A
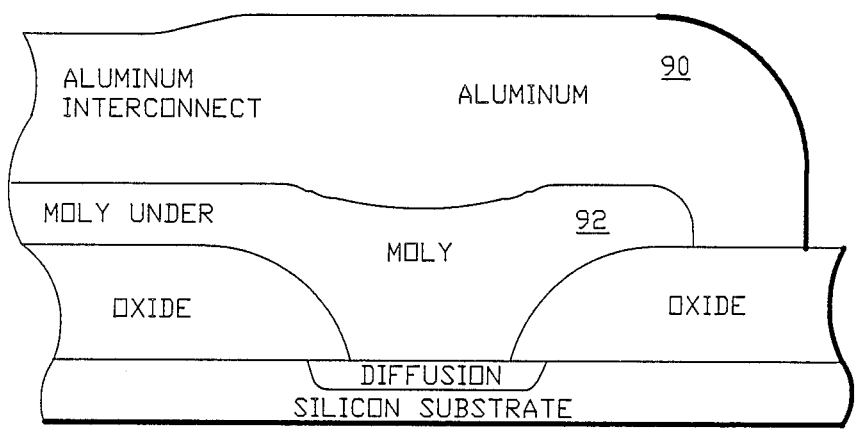
FIG.—5B the 4,975,386

PROCESS ENHANCEMENT USING MOLYBDENUM PLUGS IN FABRICATING INTEGRATED CIRCUITS

BACKGROUND OF THE INVENTION

This invention relates generally to semiconductor integrated device fabrication, and more particularly the invention relates to process enhancement through use of molybdenum interface layers for moly plugs.

The use of refractory metals in high temperature interconnect structures is known, see for example U.S. Pat. Nos. 4,152,823, 4,265,935, and 4,042,953 all for high temperature refractory metal contact assembly and multiple layer interconnect structures. In these patents a sandwich structure having outer layers of silicon and a core material of a refractory material such as molybdenum are used as interconnect lines.

In thin film resistor technology, processing difficulties are encountered due to high temperature processing of aluminum contacts on the resistors. Typically, the thin film resistors comprise a sputtered mixture of silicon, chromium, carbon, and boron. While the thin film resistors have highly precise values, temperature cycling can cause non-uniformity in contact resistances. This is particularly a problem where laser trimming is used to establish desired resistance values and in hermetically sealing the circuits and packages.

The present invention is directed to enhanced processing of semiconductor integrated circuit in which thin film resistors and the semiconductor diffusions are interconnected with a metal such as aluminum which is susceptible to high temperature processing.

SUMMARY OF THE INVENTION

An object of the invention is a process which overcomes the problem of non-uniform contact resistance between aluminum metallization and a thin film resistor.

Another object of the invention is a process which provides excellent and repeatable matching by eliminating contact resistance as a process variable.

Yet another object of the invention is improved temperature stability characteristics of thin film resistors by minimizing temperature variable contact resistance.

Yet another object of the invention is high temperature processing of a finished circuit during hermetic packaging.

Still another object of the invention is a manufacturing process and structure which allows thin film resistors to be laser trimmed with no degradation in performance of the resistor.

A feature of the invention is a molybdenum contact or moly plug process which is simple and easily integrated to any semiconductor integrated circuit process including bi-polar, PMOS, and NMOS, CMOS, and biCMOS using either metal gate, silicon gate, or refractory gate.

In accordance with another feature of the invention the moly plug process can be simultaneously or separately used to form contacts to silicon and/or diffusions in the integrated circuit. By providing a barrier between aluminum metallization and silicon diffusions the resulting contacts are more stable, uniform, low resistance, and permit exposure of the product with aluminum metallization to temperatures as high as 600° C.

The invention and objects and features thereof will be more readily apparent from the following detailed description and appended claims when taken with the drawing.

BRIEF DESCRIPTION OF THE DRAWING

FIG. 5 is a section view of a moly-aluminum clad interconnect and contact in accordance with the invention.

DETAILED DESCRIPTION OF ILLUSTRATIVE EMBODIMENTS

The use of a moly plug in accordance with the invention allows aluminum to make contact through a thermally stable barrier with other interconnects, diffusions or gates as well as thin film resistors. The process permits the simultaneous formation of another level of interconnect using the moly as an interconnect and also as a barrier plug. Further, the moly plug process allows the use of diffusion as an interconnect by allowing the contact of moly as a strap. Thus, aluminum to moly to diffusion strap can be easily created. Additionally, two or more levels of interconnects can be contacted with diffusions using the moly as a barrier between the interconnect (aluminum, polysilicon, silicide poly or refractory metals) and the diffusion. By using the moly plug process as a strap between various interconnect levels, two dissimilar interconnects that might metallurgically interact with each other can be strapped and electrically connected to each other using the moly plug process.

Figure 1:
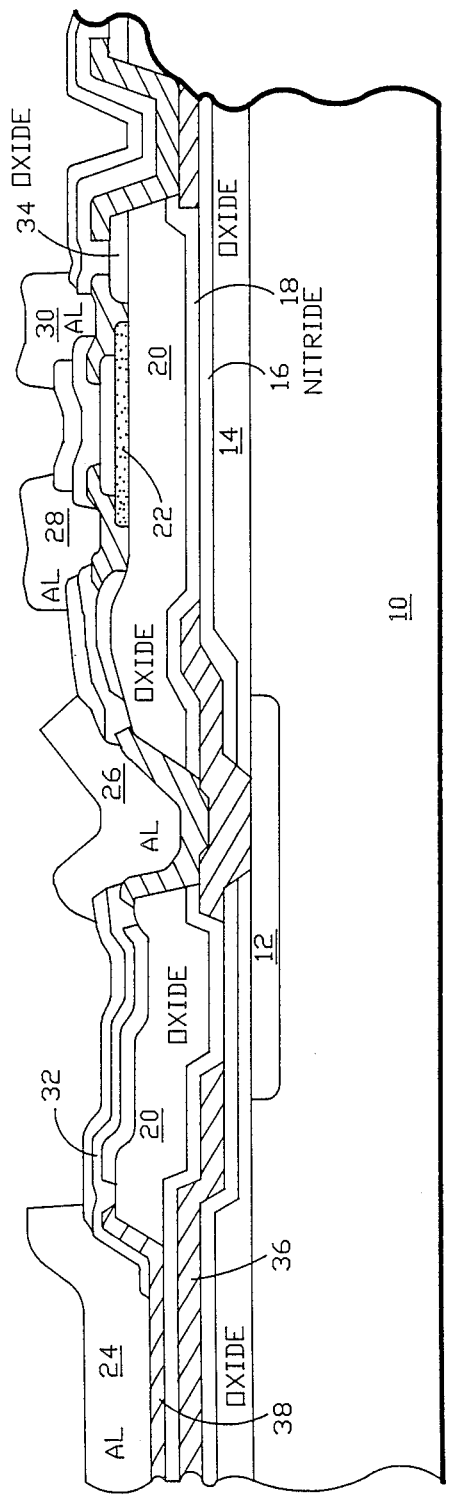
FIG. 1 is a section view of a portion of an integrated circuit illustrating multi-level interconnects and contacts in accordance with the invention.

Referring now to the drawing, FIG. 1 is a section view of a portion of an integrated circuit illustrating the general process scheme for forming multi-level interconnects and contacts between various circuit elements. In this embodiment a silicon substrate 10 has a diffused region 12 in a surface thereof. Formed on the surface is a silicon oxide layer 14 and silicon nitride layers 16, 18. A thick oxide layer 20 is formed over the nitride layers, and formed on the oxide layer 20 is a thin film resistor 22 and a plurality of aluminum contacts 24, 26, 28, and 30. Nitride and oxide layers 32 and 34, respectively, are formed on the top of the structure.

In section one of the structure a moly one layer 36 and a moly two layer 38 are separated by thin nitride layer to function as a capacitor. In section two of the circuit, the moly one and moly two layers form a plug separating the aluminum contact 26 from the diffused region 12.

In section three of the circuit, the moly one layer separates the contacts 28 and 30 from opposite ends of the thin film resistor 22.

Finally, in section four the moly one layer and the moly two layer can be used together or independently as contacts.

Figure 2:
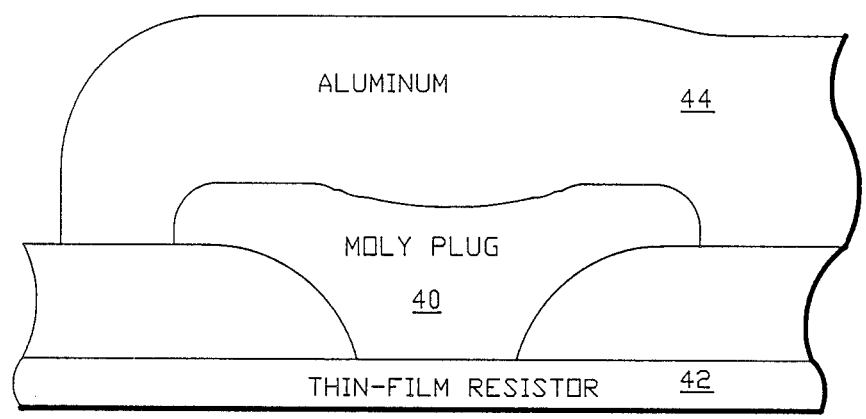
FIG. 2 is a section view of a moly plug on a thin film resistor with a top silicon layer in accordance with one embodiment of the invention.
Figure 3:
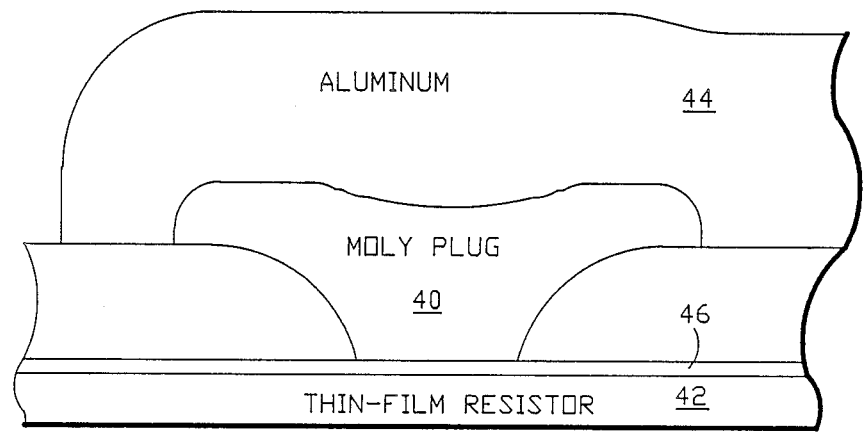
FIG. 3 is a section view of a moly plug contact on a thin film resistor with a top silicon layer in accordance with another embodiment of the invention.

FIG. 2 and FIG. 3 are section views illustrating two moly plug contacts to a thin film resistor as shown in FIG. 1. In FIG. 2, the moly plug 40 directly contacts the thin film resistor 42 and separates an overlying aluminum interconnect line 44 from the thin film resistor.

In FIG. 3 the thin film resistor 42 has a thin layer of silicon 46 on the surface which is engaged by the moly plug 40 with aluminum layer 44 separated from the silicon layer 46 by plug 40.

Following are three examples of processes in fabricating the moly plug barrier between the aluminum metallization and the thin film resistor.

Example 1: To form barrier between aluminum metallization and thin-film resistor:

Basic IC processing up to thin-film resistor
Sputter deposit thin-film resistor (Silicon thickness on top of resistor may vary from 0-5000 A)
Thin-film resistor pattern/etch
Deposit insulator (to electrically isolate and protect thin-film resistor through subsequent processing)
Thin-film resistor anneal (400C-1000C)
Cut resistor contacts (all other contacts are closed)
Deposit moly (varying moly thicknesses may be used ranging from 20-20,000 A)
Moly plug mask/etch
Contact mask/etch (opens all other contacts-silicon, gate)
Deposit metallization (A1 or A1:Si or A1:Si:Cu)
Metal pattern/etch
Alloy (400-600C in H2)
Passivation (deposit/pattern/etch)
Completed IC wafers Example 2: To form barrier between aluminum metallization and thin-film resistor:

Process Sequence 1A

Basic IC processing up to thin-film resistor
Sputter deposit thin-film resistor (silicon thickness on top of resistor may vary from 0-5000 A)
Thin-film resistor pattern/etch
Deposit insulator (to electrically isolate and protect thin-film resistor through subsequent processing)
Thin-film resistor anneal (400C-1000C)
Cut resistor contacts (all other contacts are closed)
Deposit moly (varying moly thicknesses may be used ranging from 20-20,000 A)
Moly anneal (400C-1000C) forms moly to resistor contact
Moly plug mask/etch
Contact mask/etch (opens all other contacts-silicon, gate)
Deposit metallization (A1 or AL:Si or A1:Si:Cu)
Metal pattern/etch
Alloy (400-600C in H2)
Passivation (deposit/pattern/etch)
Completed IC wafers Example 3: To form barrier between aluminum metallization and thin-film resistor:

Process Sequence - 1B

Figure 4:
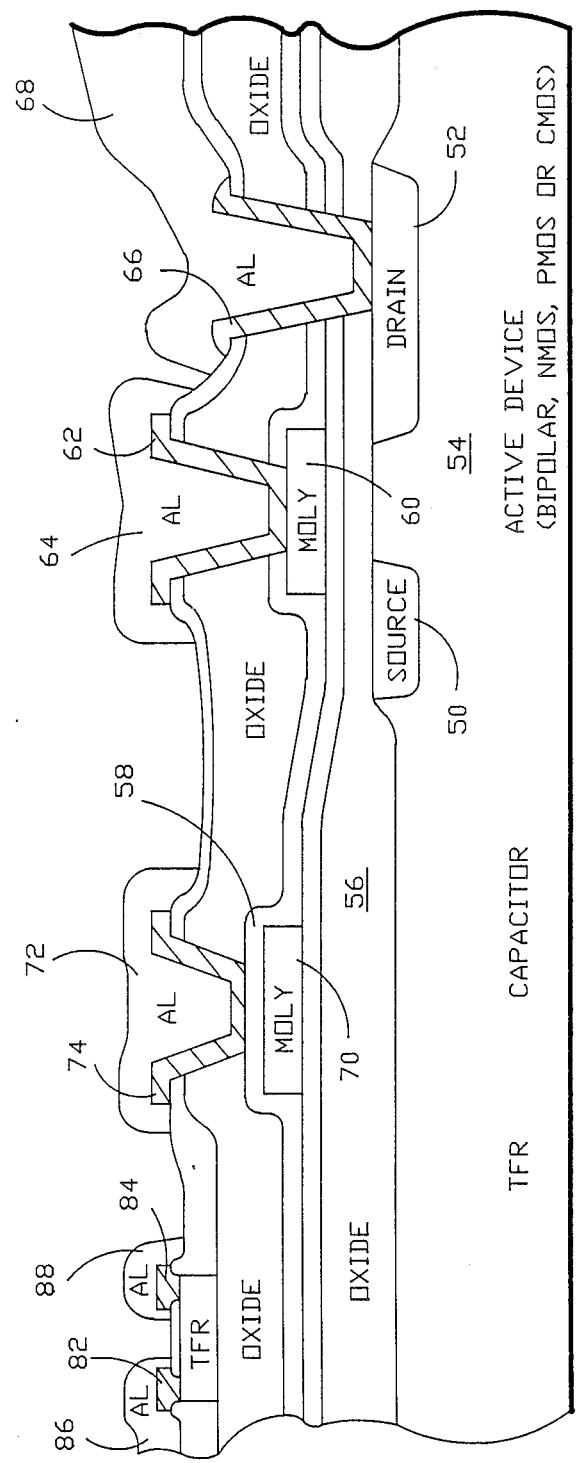
FIG. 4 is a section view of a portion of an integrated circuit illustrating other embodiments of the invention.

Basic IC processing up to thin-film resistor
Sputter deposit thin-film resistor (silicon thickness on top of resistor may vary from 0-5000 A)
Thin-film resistor pattern/etch
Deposit insulator (to electrically isolate and protect thin-film resistor through subsequent processing)
Thin-film resistor anneal (400C-1000C)
Cut resistor contacts (all other contacts are closed)
Deposit moly (varying moly thicknesses may be used ranging from 20-20,000 A)
Moly plug mask/etch
Moly anneal (400C-600C) - forms moly to resistor contact
Contact mask/etch (opens all other contacts-silicon, gate)
Deposit metallization (A1 or AL:Si or A1:Si:Cu)
Metal pattern/etch
Alloy (400-600C in H2)
Passivation (deposit/pattern/etch)
Completed IC wafers FIG. 4 is a section view of a portion of another integrated circuit in which the moly plug process is employed with active devices (e.g., bipolar, NMOS, PMOS, CMOS). In this embodiment the source 50 and drain 52 are fabricated in the surface of a silicon substrate 54 with an oxide layer 56 and a nitride layer 58 overlying the source and drain regions. A moly gate contact 60 is formed on the surface of the nitride layer 58 with a moly plug 62 separating the moly gate 60 and an overlying aluminum contact 64. Similarly, a moly plug 66 separates the drain aluminum contact 68 and the drain region 52.

A capacitor is formed by moly layer 70 and an overlying aluminum contact 72 with a nitride layer 58 therebetween along with a moly plug 74.

Finally, a thin film resistor 80 has moly plug contacts 82 and 84 separating aluminum contacts 86 and 88, respectively.

Following are examples of processes in fabricating the various circuits using moly plugs illustrated in FIG. 4.

Example 1: To form barrier between aluminum metallization and all contacts:

Basic IC processing up to thin-film resistor
Sputter deposit thin-film resistor (silicon thickness on top of resistor may vary from 0-5000 A)
Thin-film resistor pattern/etch
Deposit insulator (to electrically isolate and protect thin-film resistors through subsequent processing)
Thin-film resistor anneal (400C-1000C )
Cut resistor contacts
Cut contacts (active device)
Cut capacitor contacts
Deposit moly
Moly plug pattern/etch
Deposit metallization (A1 or AL:Si or A1:Si:Cu)
Metal pattern/etch
Alloy (400-600C in H2)
Passivation (deposit/pattern/etch)
Completed IC wafers Example 2: To form barrier between aluminum metallization and all contacts:

Basic IC processing up to thin-film resistor
Sputter deposit thin-film resistor (silicon thickness on top of resistor may vary from 0-5000 A)
Thin-film resistor pattern/etch
Deposit insulator (to electrically isolate and protect thin-film resistors through subsequent processing)
Thin-film resistor anneal (400C-1000C )
Cut resistor contacts cut contacts (active device)
Cut capacitor contacts
Deposit moly
Moly anneal (400C-1000C ) - to form low resistance contacts
Moly plug pattern/etch
Deposit metallization (A1 or A1:Si or A1:Si:Cu)
Metal pattern/etch Alloy (400–600C in H2)
Passivation (deposit/pattern/etch)
Completed IC wafers Example 3: To form barrier between aluminum metallization and all contacts:

Basic IC processing up to thin-film resistor
Sputter deposit thin-film resistor (silicon thickness on top of resistor may vary from 0–5000 A) Thin-film resistor pattern/etch
Deposit insulator (to electrically isolate and protect thin-film resistors through subsequent processing)
Thin-film resistor anneal (400C–1000C)
Cut resistor contacts
Cut contacts (active device)
Cut capacitor contacts
Deposit moly
Moly plug pattern/etch
Moly anneal (400C–1000C) - to form low resistance contacts
Deposit metallization (Al or Al:Si or Al:Si:Cu)
Metal pattern/etch
Alloy (400–600C in H2)
Passivation deposit/pattern/etch
Completed IC wafers Example 4: To form CLAD moly/aluminum metallization and to simultaneously form barrier between aluminum and all contacts:

Basic IC processing up to thin-film resistor
Sputter deposit thin-film resistor (silicon thickness on top of resistor may vary from 0–5000 A)
Thin-film resistor pattern/etch
Deposit insulator (to electrically isolate and protect thin-film resistors through subsequent processing)
Cut resistor contacts
Cut contacts (active devices)
Cut capacitor contacts
Deposit moly
Moly anneal (400C–1000C) - forms low resistance contacts
Deposit metallization (Al or Al:Si or Al:Si:Cu)
Metal pattern
Etch metal/moly
Alloy (400–600C in H2)
Passivation (deposit/pattern/etch)
Completed IC wafers Example 5: To form moly barrier between contacts with aluminum metallization:

Basic IC processing up to active devices
Cut contacts (active device)
Cut capacitor contacts
Deposit moly
Moly anneal (400C–1000C) - forms low resistance contacts
Deposit metallization (Al or Al:Si or Al:Si:Cu)
Metal pattern
Etch metal/moly
Alloy (400–600C in H2)
Passivation (deposit/pattern/etch)
Completed IC wafers FIG. 5 is a section view illustrating a molybdenum-aluminum clad interconnect line contact in accordance with another embodiment of the invention. The aluminum layer 90 (or other suitable metal layer) is formed over the moly layer 92, and then both layers are selectively etched to form the interconnect and contact structure.

There have been described novel processes in fabricating semiconductor integrated circuits in which temperature stability during and after fabrication is enhanced. The use of a moly plug can be used in various circuit components of the integrated circuit in a comparable process sequence using conventional techniques. Besides the temperature stability during lasar trimming and hermetic sealing of the circuits, the moly plug process can simultaneously or separately be used to form contacts to silicon and/or diffusions. This results in stable and uniform contacts having low contact resistance. Products with aluminum metallization can be exposed to temperatures as high as 600° C. without encountering detrimental degradation of circuit performance. Lower source/drain or diffusion resistance is facilitated by the moly plug forming a silicide during processing. CLAD metallization can be employed in which the moly barrier is formed by first sputtering moly across the wafer and then sputtering aluminum metallization. The aluminum and moly can be sequentially selectively etched to leave a CLAD pattern of aluminum and moly interconnect across the entire wafer with moly as a barrier between the aluminum and all contacts.

As used herein, "molybdenum" and "moly" include the pure element and also alloys of the element with other materials as is known in the semiconductor industry.

Thus, while the invention has been described with reference to specific embodiments and applications, the description is illustrative of the invention and is not to be construed as limiting the invention. Various modifications and applications may occur to those skilled in the art without departing from the true spirit and scope of the invention as defined by the appended claims.

I claim:

1. In the fabrication of an integrated circuit having at least one thin-film resistor, a method of interconnecting the thin-film resistor with other circuit components comprising the steps of:
    providing a semiconductor substrate with circuit components formed therein,
    forming a thin-film resistor on a major surface of said substrate,
    depositing an insulation layer on said thin-film resistor,
    annealing said thin-film resistor,
    forming contact openings through said insulation layer to said thin-film resistor,
    depositing molybdenum on said semiconductor substrate and on said thin-film resistor,
    selectively etching said molybdenum to define molybdenum plugs in said contact openings,
    depositing interconnect metallization on said semiconductor substrate, said insulation layer, and said molybdenum plugs,
    selectively etching said interconnect metallization to define an interconnect pattern, and
    alloying said semiconductor substrate.

2. The method as defined by claim 1 and including the steps of depositing and selectively etching a passivation layer over said substrate.

3. The method as defined by claim 1 and including the step of annealing said molybdenum after deposition thereof and before selectively etching said molybdenum.

4. The method as defined by claim 1 and including the step of annealing said molybdenum after selectively etching said molybdenum.

5. The method as defined by claim 1 and including the step of forming additional contact openings to circuit components formed in said substrate prior to depositing interconnect metallization whereby said circuit components are connected to said interconnect pattern.

6. In the fabrication of an integrated circuit having at least one thin-film resistor and at least one capacitor, a method of interconnecting the thin-film resistor and capacitor with other circuit components comprising the steps of:
   providing a semiconductor substrate with circuit components formed therein and at least one capacitor element formed thereon, forming a thin-film resistor on a major surface of said substrate,
   depositing an insulation layer on said major surface and over said thin-film resistor and said capacitor,
   annealing said thin-film resistor, forming contact openings to said resistor, said components in said substrate, and to said capacitor,
   depositing molybdenum on said semiconductor substrate and in said contact openings,
   selectively etching said molybdenum to define molybdenum plugs in said contact openings,
   depositing interconnect metallization over said insulation and on said molybdenum plugs,
   selectively etching said interconnect metallization to define an interconnect pattern, and
   alloying said semiconductor substrate.

7. The method as defined by claim 6 and further including the steps of depositing and selectively etching a passivation layer over said substrate.

8. The method as defined by claim 6 and further including the step of annealing said molybdenum after deposition and before selectively etching said molybdenum.

9. The method as defined by claim 6 and including the step of annealing said molybdenum after selectively etching said molybdenum.

10. In the fabrication of an integrated circuit having at least one thin-film resistor, a method of interconnecting the thin-film resistor with other circuit components comprising the steps of:
    providing a semiconductor substrate with circuit components formed therein,
    forming a thin-film resistor on a major surface substrate,
    depositing an insulation layer on said thin-film resistor,
    performing contact openings through said insulation layer to said thin-film resistor,
    depositing molybdenum on said semiconductor substrate and on said insulation,
    depositing interconnect metallization on said molybdenum,
    selectively etching said metallization and said molybdenum thereby defining an interconnect pattern, and
    alloying said metallization and molybdenum.

11. In the fabrication of an integrated circuit, a method of interconnecting circuit components comprising the steps of:
    providing a semiconductor substrate with circuit components formed therein, including at least one thin-film resistor element formed,
    providing an insulation layer over the surface of said semiconductor substrate,
    performing contact openings through said insulation layer to said circuit components,
    depositing a layer of molybdenum on said insulation layer and in said contact openings,
    annealing said molybdenum,
    depositing a metallization layer over said molybdenum,
    etching said metallization and molybdenum thereby forming an interconnect pattern, and
    alloying said interconnect pattern.

* * * * *